United States Patent [19]

Cannizzaro et al.

[11] 3,760,091

[45] Sept. 18, 1973

[54] MULTILAYER CIRCUIT BOARD

[75] Inventors: Joseph R. Cannizzaro; Charles F. Emery, both of Endicott, N.Y.

[73] Assignee: International Business Machines Corporation, Armonk, N.Y.

[22] Filed: Nov. 16, 1971

[21] Appl. No.: 199,206

[52] U.S. Cl. .......... 174/68.5, 117/212, 317/101 CM

[51] Int. Cl. .......... H05k 1/04

[58] Field of Search .......... 174/68.5; 317/101 CM, 101 CE; 117/212, 217; 156/3, 150

[56] References Cited

UNITED STATES PATENTS 3,146,125 8/1964 Schneble, Jr. et al. .......... 174/68.5 UX

FOREIGN PATENTS OR APPLICATIONS 2,047,204 9/1970 Germany .......... 174/68.5

OTHER PUBLICATIONS

Cannizzaro et al., "Multilayer Circuit Board," IBM Technical Disclosure Bulletin, Vol. 13, No. 7, Dec. 1970, p. 2075.

*Primary Examiner*—Darrell L. Clay

*Attorney*—J. Jancin, Jr. et al.

[57] ABSTRACT

An improved multilayer circuit board and a method of manufacture thereof comprising a plurality of layers of conductive material separated by layers of dielectric material. Selected dielectric layers include a readily, electrolessly plateable, hydrophilic material while other dielectric layers are made of a hydrophobic material which is not readily plateable. All layers are laminated, and holes are formed in the board where layers of conductive material are to be interconnected. An electroless plating interconnects only those layers of conductive material separated by hydrophilic dielectric material, leaving other layers separated by hydrophobic dielectric material isolated. Embodiments are also disclosed in which all layers of conductive material are interconnected regardless of the type of dielectric material separating them.

1 Claim, 5 Drawing Figures

PATENTED SEP 18 1973 3,760,091

LEGEND

CONDUCTIVE MATERIAL

EPOXY, PHENOLIC, POLYVINYL ACETAL, POLYVINYL ALCOHOL, POLYVINYL ACETATE

POLYIMIDE, POLYETHYLENE, POLYPROPYLENE, POLYPHENYLENE OXIDE, POLYSULFONE

INVENTORS

JOSEPH R. CANNIZZARO
CHARLES F. EMERY

BY Maurice H. Klitzman
ATTORNEY

MULTILAYER CIRCUIT BOARD

BACKGROUND OF THE INVENTION

1. Field of the Invention

This invention relates to printed circuit boards and, more particularly, to multilayer printed circuit boards having vertically interconnected conductive layers.

2. Description of the Prior Art

Although printed circuit boards are well known, it will be helpful to review some of the principles of printed circuit technology that particularly apply to this invention. In a typical printed circuit board, a layer or sheet of dielectric material has conductive material laminated to one or both surfaces. The conductive material is etched in a pattern to form circuit paths between points on the board where components are to be connected. When increased circuit density has been desirable, it has been a common practice to produce a multilayer printed circuit board in which a plurality of layers of dielectric material support and separate a plurality of layers of conductive material.

Electrical connections between the layers of conductive material are accomplished by drilling holes through the printed circuit board and depositing a conductive material on the walls of the hole. In multilayer printed circuit boards, it has been common to deposit a conductive material on all portions of the walls of the through hole. This practice of coating the entire hole has the disadvantage of forming a common electrical connection between every layer of conductive material through which the hole projects. In solving this problem, it has been proposed to etch away the conductive material of those layers with which electrical connection is not desired at particular hole locations. This solution has the disadvantage of not allowing any contact with the etched layer of conductive material, although in certain instances, contact between a first layer and a second layer is desirable, while contact between a first layer and a third layer is undesirable.

Another proposed solution to this problem is the drilling of holes which extend only through those layers with which a connection is desirable. Such a solution would solve the problem in a printed circuit board having four layers of conductive material when it is desirable to interconnect the first and second layers or any other group of layers which are to be connected in sequence. If it is desired to connect the first layer to the second layer, and to separately connect the third layer to the fourth layer, two fully plated holes would be required, with each of the holes extending only through the layers to be interconnected.

OBJECTS

An object of this invention is to provide improved circuit density to multilayer printed circuit boards.

Another object of this invention is to provide independent electrical interconnection of different layers of conductive material in a single through hole of a multilayer printed circuit board.

Another object of this invention is to provide electrical interconnections to selected layers of conductive material in a through hole without having to etch away other layers with which a connection is not desired.

A further object of this invention is to provide independent electrical interconnection of different conductive layers at the same through hole as well as connection of all conductive layers in other through holes.

SUMMARY OF THE INVENTION

The above and other objects are accomplished by providing a multilayer printed circuit board and method of manufacture thereof, said board having layers of substantially hydrophilic dielectric material used as the dielectric to separate layers of conductive material that are to be interconnected, while layers of substantially hydrophobic dielectric material are used to isolate these layers of conductive material from other layers of conductive material with which interconnection is not desired. No surface treatment is performed to the walls of the through holes, and thus, interconnecting conductive material is electrolessly plated to those portions of the walls of the through hole in which layers of substantially hydrophilic dielectric material are present and in which layers of conductive material are present. In the simplest example, layers of substantially hydrophilic dielectric material separate layers of conductive material to be interconnected and alternate with layers of substantially hydrophobic dielectric material. In this structure, a single through hole can carry several electrically isolated interconnections. Since fewer through holes are required for the same number of interconnections, the board provides improved circuit density.

When it is desirable to provide a common connection with every layer of conductive material, a totally coated through hole may be provided in any one of several ways. First, the through hole may be pre-drilled or pre-punched in the layers of substantially hydrophobic dielectric material so that, when laminated, the substantially hydrophilic dielectric material will "flow" to fill the void left by the oversized hole in the substantially hydrophobic dielectric material to provide the walls of the through holes with substantially hydrophilic dielectric material at all dielectric portions. If the layers of substantially hydrophobic dielectric material are thin enough, even if the substantially hydrophilic dielectric material does not "flow" during lamination, the electroless coating which adheres to the walls of the through hole comprised of substantially hydrophilic dielectric material will bridge across from one such layer to the next. Finally, another method of providing a totally plated through hole is to perform a surface treatment to the walls so that the substantially hydrophobic dielectric material may be readily sensitized as well as the substantially hydrophilic dielectric material. In this manner all layers of dielectric material will accept the electroless coating.

The foregoing and other objects, features, and advantages of the invention will become apparent from the following more particular description of preferred embodiments of the invention, as illustrated in the accompanying drawing.

DESCRIPTION OF THE PREFERRED EMBODIMENTS

Figure 1:
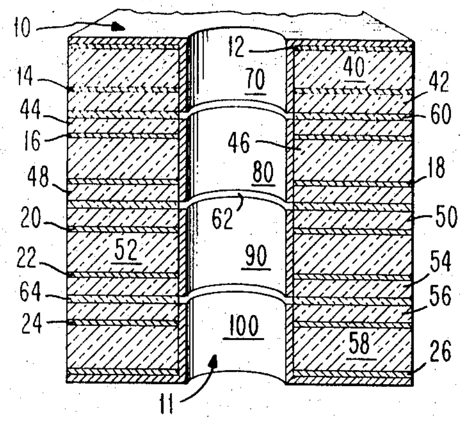
FIG. 1 shows a cross-sectional view of a through hole in which four electrically independent interconnections are made.

In the multilayer printed circuit board 10 of FIG. 1, layers of conductive material 12, 14, 16, 18, 20, 22, 24, and 26 are separated by layer of dielectric material 40, 42, 60, 44, 46, 48, 62, 50, 52, 54, 64, 56, and 58. In through hole 11, interconnecting conductive material 70, electrically interconnects layers of conductive material 12 and 14 of board 10. Conductive material 70 may form additional conductive material on the outermost surface of layer 12. It can be seen that conductive material 70 adheres to those portions of the walls of through hole 11 comprised of layers 12, 40, 14, and 42. Conductive material 70 does not adhere to dielectric layer 60 for reasons that will be explained hereinafter.

Similarly, interconnecting conductive material 80 interconnects layers of conductive material 16 and 18 by adhering to those portions of the walls of through hole 11 comprised of layers 44, 16, 46, 18, and 48. Conductive material 80 does not adhere to those portions of the walls of through hole 11 comprised of layers 60 and 62. Interconnecting conductive material 90 interconnects layers of conductive material 20 and 22 by adhering to those portions of the walls of through hole 11 comprised of layers 50, 20, 52, 22, and 54. Conductive material 90 does not adhere to those portions of the walls of through hole 11 comprised of layers 62 or 64. Interconnecting conductive material 100 interconnects layers of conductive material 24 and 26 by adhering to those portions of the walls of through hole 11 comprised of layers 56, 24, 58, and 26. Conductive material 100 does not adhere to those portions of the walls of through hole 11 comprised of layer 64, and further, conductive material 100 may form additional conductive material on the outermost surface of layer 26.

It can thus be seen in FIG. 1 that four electrically independent, selective interconnections are made in a single through hole. We have found it possible to achieve such selective, independent interconnections by using two types of dielectric material in the multilayer printed circuit board 10. Layers of dielectric material 40, 42, 44, 46, 48, 50, 52, 54, 56, and 58 are made of a material that can be readily and effectively sensitized for electrolessly plating without the requirement of a surface treatment step before the sensitization. Layers of dielectric material 60, 62, and 64, on the other hand, are made of materials which require extensive surface treatment before an effective sensitization step of the conventional electroless plating technique can be performed. In forming the interconnecting conductive materials 70, 80, 90, and 100 on the walls of through hole 11, no surface treatment is performed to any portion of the walls of through hole 11. The walls are sensitized, but since no surface treatment is performed, the sensitization is effective only to layers 40, 42, 44, 46, 48, 50, 52, 54, 56, and 58. The electroless coating of interconnecting conductive materials 70, 80, 90, and 100 will adhere only to the portions of the walls of through hole 11 comprised of layers of dielectric material 40, 42, 44, 46, 48, 50, 52, 54, 56, 58, and layers of conductive material 12, 14, 16, 18, 20, 22, 24, and 26.

Materials which are characterized as substantially hydrophobic in nature usually contain no polar groups along the polymer chain. Examples of some of these materials are polyimides, polyethylene, polypropylene, polyphenylene oxide, and polysulfone. These examples require surface treatment before an effective sensitization step of the conventional electroless plating technique can be performed. Conversely, polymers which are substantially hydrophilic in nature often contain polar groups along the polymer chain. Some examples of these polymers include polyvinyl acetal resins, polyvinyl alcohol, polyvinyl acetate, epoxy resins, and phenolic resins. These examples do not require a surface treatment step before the sensitization step of the conventional electroless plating technique can be performed. Layers of dielectric material 40, 42, 44, 46, 48, 50, 52, 54, 56, and 58, on which it is desirable for interconnecting conductive material to adhere, are substantially hydrophilic dielectric materials. Layers of dielectric material 60, 62, and 64, on which it is not desirable for interconnecting conductive material to adhere, are substantially hydrophobic dielectric materials.

Figure 2:
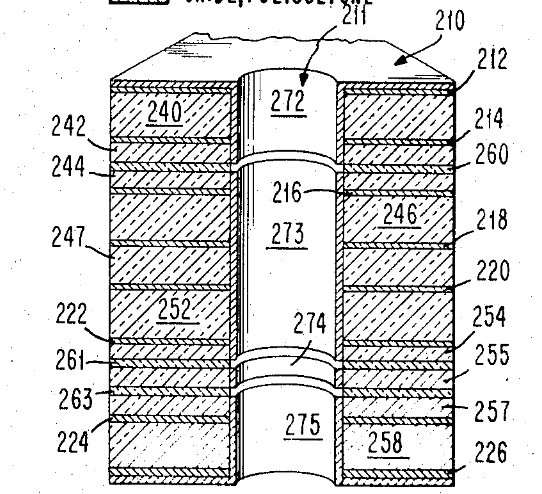
FIG. 2 shows a cross-sectional view of a through hole in which three electrically independent interconnections are made.

Multilayer printed circuit board 210, shown in FIG. 2, is comprised of layers of conductive material 212, 214, 216, 218, 220, 224, 226, and layers of dielectric material 240, 242, 260, 244, 246, 247, 252, 254, 261, 255, 263, 257, and 258. In through hole 211, interconnecting conductive material 272 electrically interconnects layers of conductive material 212 and 214, and may form additional conductive material on the outermost surface of layer 212. Conductive material 272 adheres to portions of the walls of through hole 211 comprised of layers 212, 240, 214, and 242. Conductive material 272 does not adhere to those portions of the walls of through hole 211 comprised of layer 260.

Similarly, interconnecting conductive material 273 electrically interconnects layers of conductive material 216, 218, 220, and 222. Conductive material 273 adheres to those portions of the walls of through hole 211 comprised of layers 244, 216, 246, 218, 247, 220, 252, 222, and 254. Conductive material 273 does not adhere to those portions of the walls of through hole 211 comprised of dielectric layers 260 and 261. Conductive material 274 adheres only to those portions of the walls of through 211 comprised of dielectric layer 255. Interconnecting conductive material 275 electrically interconnects layers of conductive materials 224 and 226 and may form additional conductive material on the outermost surface of layer 226. Conductive material 275 adheres to those portions of the walls of through hole 211 comprised of layers 257, 224, 258, and 226. Conductive material 275 does not adhere to those portions of the walls of through hole 211 comprised of dielectric layer 263.

Through hole 211, therefore, includes three independent electrical interconnections. Interconnecting conductive material 272 electrically interconnects two layers of conductive material. Interconnecting conductive material 273 interconnects four more layers of conductive material, while interconnecting conductive material 275 interconnects two additional layers of conductive material. As stated previously, layers of dielectric material on which it is desirable for interconnecting conductive material to adhere, are substantially hydrophilic. In board 210, these substantially hydrophilic dielectric layers are 240, 242, 244, 246, 247, 252, 254, 255, 257, and 258. Layers of dielectric material on which it is not desirable for interconnecting conductive material to adhere are substantially hydrophobic dielectric materialls. In board 210 these substantially hydrophobic dielectric layers are 260, 261, and 263. It can readily be seen in board 210 that the addition of two separate layers 261 and 263 of substantially hydrophobic dielectric material, separated by layers 255 of substantially hydrophilic dielectric material, serve to provide greater separation between layers of conductive material 222 and 224 than is provided between the corresponding layers 22 and 24 of board 10.

Such increased separation is often desirable to lessen the capacitance between two layers of conductive material in a multilayer printed circuit board.

Boards 10 and 210 may be fabricated in a number of different ways. A dielectric material typically used in printed circuit board manufacture is comprised of a glass cloth or glass mat which has been impregnated with a resin. Such a material is commonly referred to as "prepreg," a term which indicates that the glass cloth or mat has been pre-impregnated with the resin. Prepreg is commonly available in a state in which the resin has been partially cured, such prepreg being known as B stage prepreg. B stage prepreg is generally dry and tack-free to handle. After being heated, pressed, and fully cured, prepreg is said to be in its C stage. Prepreg is commonly used as a bonding material, as well as a dielectric material, in a multilayer printed circuit board. When layers of conductive material or other layers of dielectric material are placed in intimate contact with B stage prepreg, such other layers become bonded to the prepreg during the heating and pressing steps required to fully cure the prepreg to its C stage.

C stage material is commonly available in sheet from with a layer of conductive material disposed on one or both sides of the sheet. Typically, the layer of conductive material is a metal foil such as copper.

Because epoxy resins are substantially hydrophilic in nature, a prepreg material comprised of glass cloth with epoxy resin impregnated therein is a substantially hydrophilic dielectric material. Such a material may be used fo the layers of substantially hydrophilic dielectric material in FIGS. 1 and 2. In board 10, layers of dielectric material 40, 42, 44, 46, 48, 50, 52, 54, 56, and 58 may be B stage prepreg containing an epoxy resin. Layers of dielectric material 40, 46, 52, and 58, may include layers of conductive material disposed on both sides thereon, which, in board 10, would be layers of conductive material 12, 14, 16, 18, 20, 22, 24, and 26. The desired circuit patterns may be etched on layers 14, 16, 18, 20, 22, and 24 before board 10 is laminated. Etching of layers of conductive material 12 and 16 may be delayed until after the board is laminated and after the interconnections are formed in the through hole, since in forming these interconnections additional conductive material is formed on the outermost surfaces of layers 12, and 16. After the patterns of layers 14, 16, 18, 20, 22 and 24 are etched, the layers are stacked as shown in FIG. 1. Between layers of conductive material 14 and 16, layers of dielectric material 42 and 44, which may be B stage prepreg containing an epoxy resin, are used to bond substantially hydrophobic dielectric layer 60 into the composite structure. Between layers of conductive material 18 and 20, layers of dielectric material 48 and 50, which may be B stage prepreg containing an epoxy resin, are used to bond substantially hydrophobic dielectric layer 62 into the composite structure. Between layers of conductive material 22 and 24, layers of dielectric material 54 and 56, which may be B stage prepreg containing an epoxy resin, are used to bond substantially hydrophobic dielectric layer 64 into the composite structure.

It is understood that in describing FIG. 1, it is contemplated that layers of substantially hydrophobic dielectric material 60, 62, and 64, are obtained in fully cured form and require a bonding agent in order that said layers 60, 62, and 64 fully adhere to the other layers of the board. If layers 60, 62, and 64 are obtained in a self adhering form, or with a dielectric adhesive or bonding agent disposed thereon, layers 42, 44, 48, 50, 54, and 56 would be unnecessary, the later layers being used for bonding purposes. On the other hand, these latter layers 42, 44, 48, 50, 54, and 56 may also be important for providing additional separation between layers of conductive material 14 and 16, 18 and 20, and 22 and 24 to lower the capacitance between these layers.

It is also understood that board 210, in FIG. 2, may be fabricated in accordance with the same principles taught above for fabricating board 10.

When a polyimide is used for the substantially hydrophobic dielectric layers, when a prepreg containing an epoxy resin is used for the substantially hydrophilic layers, and when copper is used for the layers of conductive material of board 10, the method for plating through hole 11 comprises the steps of initially cleaning hole 11 after drilling, with an ammonium sulfate solution and one or more acid rinses to remove grease and other contaminants from the copper and dielectric material which might inhibit deposition. The substantially hydrophilic prepreg of layers 40, 42, 44, 46, 48, 50, 52, 54, 56, and 58 are then sensitized with acid solutions of stannous-chloride and palladium chloride to produce metallic nucleating sites for the electroless deposition of layers of copper 70, 80, 90, and 100 from a basic copper bath. Since layers of substantially hydrophobic dielectric material 60, 62, and 64 are essentially acid resistent, the method is an all acid system accept for the basic electroless copper bath. The use of alkaline reagents prior to sensitization must be avoided to assure that no deposition occurs on exposed surfaces of layers 60, 62, and 64 in through hole 11.

Interconnecting conductive materials 70, 80, 90, and 100 may be formed to any desired thickness by a number of methods. One method would be employ the process described in the preceding paragraph to obtain thin copper coatings of interconnecting conductive materials which may then be thickened by electroplating additional copper from an acid solution of copper pyrophosphate or copper flouroborate. Another method would be to employ the process described in the preceding paragraph, exclusively, by allowing the electroless copper coatings of interconnecting conductive material to reach the desired thickness before removing board 10 from the basic copper bath.

When corresponding materials are used for the layers of board 210, the process for plating through hole 211 is identical to the process outlined above.

Figure 3:
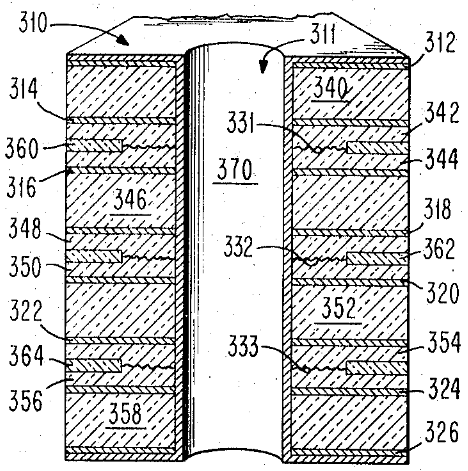
FIGS. 3–5 show cross-sectional views of different embodiments to totally coated through holes in which all layers of conductive material are interconnected.

It may often be desirable to provide, in addition to the independent interconnections provided in through holes 11 and 211, a continuously plated through hole which interconnects all layers of conductive material extending to the walls of the through hole. Referring now to FIG. 3, multilayer printed circuit board 310 has through hole 311 which is coated with a continuous layer of interconnecting conductive material 370. Board 310, shown in FIG. 3, may be another segment of board 10, shown in FIG. 1, or board 310 may be a separate board. Insofar as any reference numeral of board 310 is exactly three hundred (300) greater than a corresponding reference numeral of board 10, the materials may be the same.

Prior to assembly and lamination of board 310, holes larger than through hole 311 are drilled in substantially hydrophobic dielectric layers 360, 362, and 364, with the centers of said holes being positioned in the locations that will be used for the center of hole 311. The layers are then fabricated in accordance with the explanation given for the fabrication of board 10. If a substantially hydrophilic dielectric material which has not been fully cured is used for layers 342, 344, 348, 350, 354, and 356, and provided that substantially hydrophobic layers 360, 362, and 364 are relatively thin, the partially cured, substantially hydrophilic dielectric material, will flow together at areas 331, 332, and 333 during the heating and pressing steps required for laminating all of the layers of board 310. After through hole 311 has been drilled in the composite structure of board 310, the walls of the through hole 311 will be comprised of layers of conductive material separated by layers of substantially hydrophilic dielectric material. All portions of the walls of through hole 311 may now be sensitized and electrolessly coated with interconnecting conductive layer 370 by employing the same method described above for the independent interconnections in through hole 11 of board 10.

Figure 4:
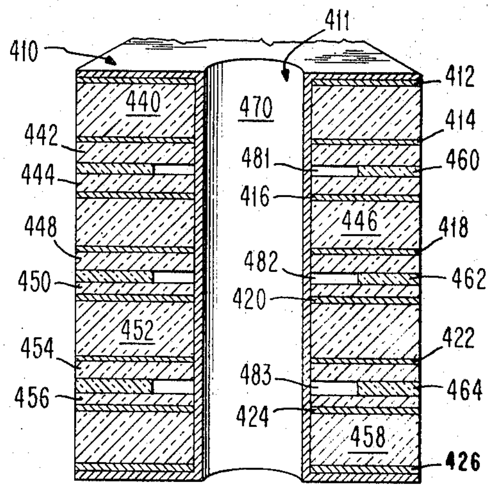

FIG. 4 shows another embodiment in which a continuously plated through hole interconnects all layers of conductive material extending to the walls of the through hole. Multilayer printed circuit board 410 has through hole 411 which is coated with a continuous layer of interconnecting conductive material 470. Board 410, shown in FIG. 4, may be another segment of board 10, shown in FIG. 1, or board 410 may be a separate board. Insofar as any reference numeral of board 410 is exactly four hundred (400) greater than a corresponding reference numeral of board 10, the materials may be the same.

Prior to assembly and lamination of board 410, holes larger than hole 411 are drilled in substantially hydrophobic dielectric layers 460, 462, and 464, with the centers of said holes being positioned in the location that will be used for the center of hole 411. The layers are then fabricated in accordance with the explanation given for the fabrication of board 10. If a substantially hydrophilic dielectric material which has been fully cured is used for layers 442, 444, 448, 450, 454, and 456, these layers will not flow together during the heating and pressing steps required for laminating all of the layers of board 410, and thus voids 481, 482, and 483 will be formed. After through hole 411 has been drilled in the composite structure of board 410, the walls of through hole 411 will be comprised of layers of conductive material separated by layers of substantially hydrophilic dielectric material and voids 481, 482, and 483. The layers of conductive material and the layers of substantially hydrophilic dielectric material extending to the walls of through hole 411 may now be sensitized and electrolessly coated with interconnecting conductive layer 470 by employing the same method described above for the independent interconnections in through hole 11 of board 10. So long as substantially hydrophobic layers 460, 462, and 464 are relatively thin, interconnecting conductive layer 470 will bridge across voids 481, 482, and 483 to form a continuous interconnecting conductive layer.

Figure 5:
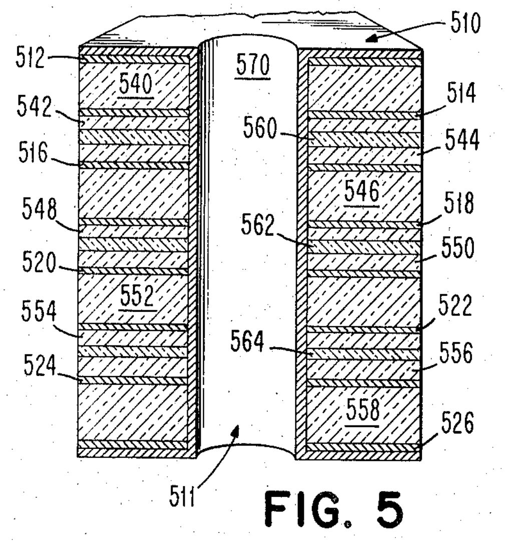

FIG. 5 shows still another embodiment in which a continuously plated through hole interconnects all layers of conductive material extending to the walls of the through hole. Multilayer printed circuit board 510 has through hole 511 which is coated with a continuous layer of interconnecting conductive material 570. Board 510, shown in FIG. 5, may be another segment of board 10, shown in FIG. 1, or board 510 may be a separate board. Insofar as any reference numeral of board 510 is exactly 500 greater than any corresponding reference numeral of board 10, the materials may be the same.

The laminated structure of board 510 is fabricated in accordance with the explanation given for the fabrication of board 10. Through hole 511, in which a continuous coating of conductive material is desired, is drilled in board 510 before any other holes are drilled (not shown) in which several independent interconnections are desired. All portions of the walls of through hole 511 receive the surface treatment necessary in order that substantially hydrophobic dielectric layers 560, 562, and 564 may be properly sensitized. Since no other holes have been drilled in the board in which it would be undesirable to provide with this surface treatment, the entire board may be immersed for surface treatment. After all portions of the walls of through hole 511 have received this surface treatment, the walls may now be sensitized and electrolessly coated with interconnecting conductive layer 570 by employing the same method described above for the independent interconnection in through hole 11 of board 10. Other through holes (not shown) may now be drilled in board 510 and coated in a manner to independently interconnect various layers of conductive material.

It is well known that it is not necessary for every layer of dielectric material to contain a base material such as glass cloth or mat for strength, since a multilayer board of strength adequate for many applications could be obtained by including this base material in only some of the layers of dielectric materials. Other layers of dielectric material, whether they be substantially hydrophilic or substantially hydrophobic, could lack this base material.

It is further recognized that the invention heretofore described may be practiced to selectively interconnect layers of conductive material elsewhere than in a through hole of the multilayer printed circuit board. For example, layers of conductive material may be selectively interconnected at an edge of the board in the manner of this invention, without drilling a through hole.

It is also recognized that the invention heretofore described resides in the use of two different kinds of dielectric materials, wherein one of the materials is more readily plateable than the other. In the description above, the substantially hydrophilic dielectric materials are more readily plateable than the substantially hydrophobic dielectric materials.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A multilayer printed circuit board comprising:

a plurality of conductive layers, each of said conductive layers being separated from the next of said conductive layers by an insulative layer;

at least one of said insulative layers between two of said conductive layers and being made entirely of a first dielectric material selected from the group consisting of polyvinyl acetal, polyvinyl alcohol, polyvinyl acetate, epoxy and phenolic, and said first dielectric material being hydrophilic to an acid solution of stannous chloride and palladium chloride so said solution can produce metallic nucleating sites for the electroless deposition of metal onto said first dielectric material;

at least one other insulative layer between two of said conductive layers and having a second dielectric material sandwiched between said first dielectric material, said second dielectric material selected from the group consisting of polyimide, polyethylene, polypropylene, polyphenylene oxide and polysulfone, and said second dielectric material being hydrophobic to an acid solution of stannous chloride and palladium chloride, so said solution cannot produce metallic nucleating sites for the electroless deposition of metal onto said second dielectric material;

at least one electrolessly plated selective interconnection, said interconnection electrically connecting conductive layers separated by insulative layers made up entirely of said first dielectric material and said interconnection being electrically disconnected between conductive layers separated by insulative layers made up of said second dielectric material sandwiched between said first dielectric material, said second dielectric material being void of an electroless plating.

* * * * *